United States Patent [19]
Young

[11] Patent Number: 5,938,601
[45] Date of Patent: Aug. 17, 1999

[54] NUCLEAR MAGNETIC RESONANCE IMAGING APPARATUS

[75] Inventor: Ian Robert Young, Nr. Marlborough, United Kingdom

[73] Assignee: Picker International, Inc., Highland Heights, Ohio

[21] Appl. No.: 08/976,227

[22] Filed: Nov. 21, 1997

[30] Foreign Application Priority Data

Nov. 21, 1996 [GB] United Kingdom .................... 9624270
Oct. 10, 1997 [GB] United Kingdom .................... 9721403

[51] Int. Cl.[6] ........................................................ A61B 5/055
[52] U.S. Cl. ............................ 600/411; 324/318; 324/322
[58] Field of Search ..................................... 600/411, 410, 600/407; 128/899; 324/318, 322

[56] References Cited

U.S. PATENT DOCUMENTS

| 4,572,198 | 2/1986 | Codrington . | |
|---|---|---|---|
| 4,932,411 | 6/1990 | Fritschy et al. . | |
| 4,989,608 | 2/1991 | Ratner | 128/653 A |
| 5,271,400 | 12/1993 | Dumoulin et al. | 128/653.2 |
| 5,429,132 | 7/1995 | Guy et al. | 128/653.1 |
| 5,437,277 | 8/1995 | Dumoulin et al. | 128/653.1 |
| 5,447,156 | 9/1995 | Dumoulin et al. | 128/653.2 |
| 5,562,698 | 10/1996 | Parker | 606/200 |
| 5,699,801 | 12/1997 | Atalar et al. | 128/653.2 |

Primary Examiner—Scott M. Getzow
Assistant Examiner—Eleni Mantis Mercader
Attorney, Agent, or Firm—Timothy B. Gurin; John J. Fry

[57] ABSTRACT

A tool or device for use in interventional MRI has a matrix of electrical conductors formed on or carried by the outer surface of the tool or device so that in use energisation of the conductors can be effect in order to enable the susceptibility of the tool or device to be varied and thus the apparent shape of the tool or device to be varied.

24 Claims, 1 Drawing Sheet

NUCLEAR MAGNETIC RESONANCE IMAGING APPARATUS

FIELD OF THE INVENTION

The present invention relates to Nuclear Magnetic Resonance Imaging Apparatus (known as MRI) apparatus and more particularly to tools and other devices that are used for interventional MRI.

BACKGROUND

Whilst MRI apparatus is always used for providing an image of the relevant part of the patient's body there are situations where in addition to merely providing the image some interventional action is taken with respect to the patient. A typical action would be to obtain a biopsy using a biopsy needle.

The present invention is concerned with such interventional activity and more particularly with the problem that the tools or devices used for such activity can and often do cause problems as far as the imaging is concerned.

It is known that unless such a device has virtually the same magnetic susceptibility as the tissue of the patient which surrounds that device it will give rise to a distorted image of itself and of the patient's surrounding tissue. Ideally the tool or device should have a magnetic susceptibility that does not deviate from that of the patient's tissue by more than several percent. A further practical problem is that the magnetic susceptibility of a patient's tissue is not fixed but varies depending upon the part of the body and in particular the blood flow or content.

Generally in the past, such devices or tools have been made of incompatible materials (i.e. badly matched materials), such as special stainless steels thus creating the problem that artifacts are generated which range from the total obliteration of the image to quite substantial increases in size and apparent changes of shape of the item being imaged.

Regulatory authorities have been concerned to define the term "MR compatibility" bearing in mind that achieving a perfect match may not be possible. Indeed, some workers have deliberately introduced susceptibility differences into small objects with too good a susceptibility match, so that they are very difficult to see on the images.

More specifically one problem is a mismatch between the apparent shape and size of the tool or device as displayed and its real shape and size. The extent of the distortion depends on the size, shape, the material and the orientation of the tool or device in relation to the main magnetic field.

The form of the artifact is complicated in interventional MRI by the diversity of equipment that is likely to be used in it and also by the fact that tools or devices can change their shape or configuration. For example, a pair of scissors can open or shut. A cannula which is being used to press a catheter or some other object into the body may initially be a hollow cylinder filled with, for example, blood, and may subsequently contain a guide wire or other device of a different susceptibility. This alteration could grossly change the apparent image appearance of the cannula.

SUMMARY OF THE INVENTION

The present invention is concerned with minimising the uncontrolled effects of this kind of artifact.

According to the present invention a tool or device for use in interventional MRI has a matrix of electrical conductors formed on or carried by the outer surface of the tool or device so that in use energisation of the conductors can be effected in order to enable the magnetic susceptibility of the tool or device to be varied and thus the apparent shape of the tool or device to be varied.

The term "matrix" is intended to cover any arrangement of conductors from a mesh to two simple conductors running parallel to the longitudinal axis of the tool.

Preferably the matrix is in the form of a mesh of conductors formed in the tool surface by deposition. Alternatively the conductors could be in the form of fine wires stuck to the tool's outer surface.

According to one aspect of the invention intersecting conductors of the mesh intersect at an angle in the range of substantially 45°–90° to one another.

The exact form or pattern of the conductors will depend upon the shape and configuration of the tool or device to which the invention is to be applied.

The essence of the invention is that the magnetic susceptibility of the tool or device can be tuned to some extent by electrical energisation of the conductor matrix to enable the visualised shape of the tool to be adjusted to correct for distortions caused by a mismatch between the magnetic susceptibilities of the tool or device and the surrounding tissue of the patient.

DRAWINGS

How the invention may be carried out will now be described by way of example only and with reference to the accompanying drawings in which.

DESCRIPTION OF THE INVENTION

Figure 1:
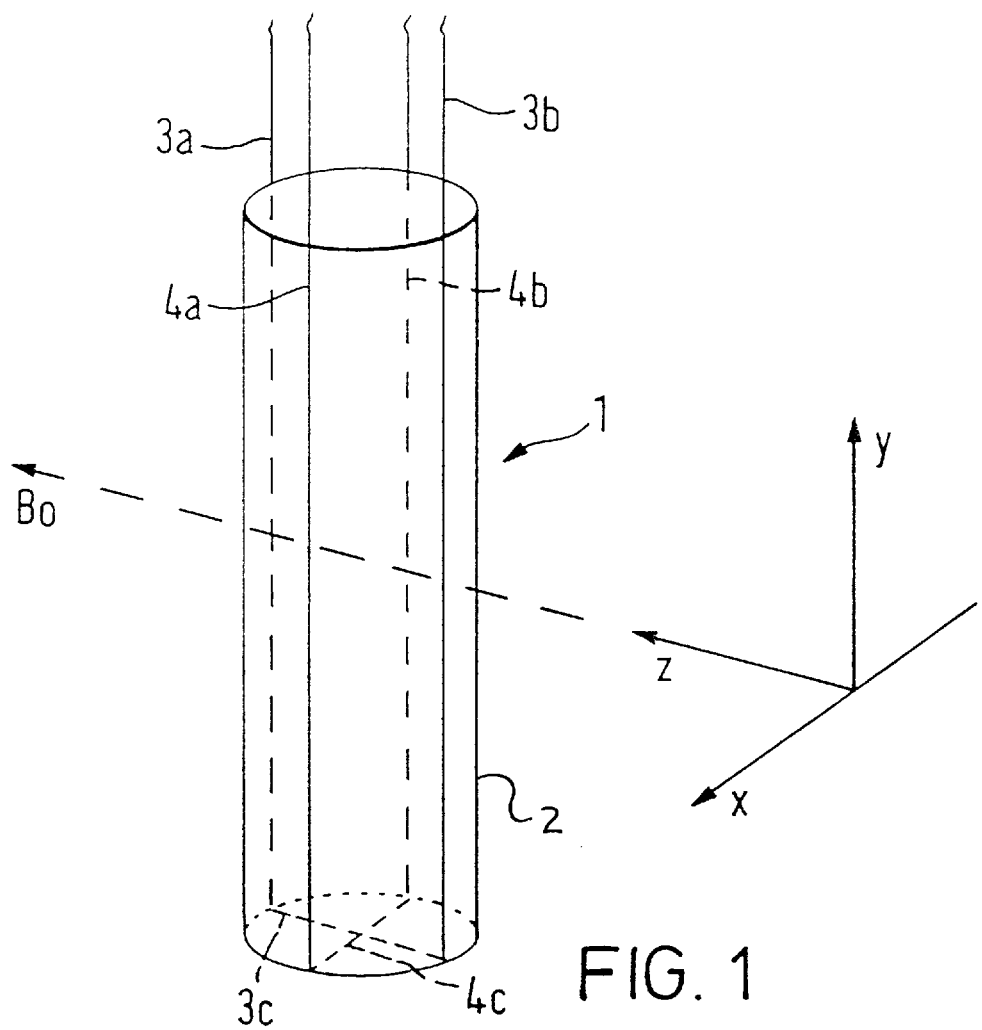
FIG. 1 is an enlarged fragmentary perspective view of part of a biopsy needle to which the present invention is applied.

FIG. 1 illustrates a cylindrical portion 2 of a part of a biopsy needle 1 which typically would be about six inches long and have a hook at one end, the biopsy needle being for use in an interventional MRI procedure.

The simplest form of the invention is illustrated, for clarity, but as indicated earlier a preferred embodiment would comprise a mesh of conductors with the intersecting conductors doing so at substantially 90°. The design of the mesh is such that irrespective of the orientation of the needle in relation to the main magnetic field at least one of the wires of the mesh when energised, would produce a field change sufficient to change the apparent shape of the needle.

The needle 1 has a cylindrical portion 2 which is provided with two electrical conductors 3 and 4 on its outer surface which have lengths 3a, 3b and 4a, 4b respectively which run parallel to the longitudinal axis of the tool 1 on diametrically sides thereof. The lengths 3a, 3b are joined by a portion 3c of the conductor 3 and the lengths 4a, 4b are joined by a portion 4c of the conductor 4, the portions 3c and 4c being at 90° to one another and extending across the end of the needle 1.

The x, y and z axes are indicated in conventional fashion and is also the main magnetic field Bo along the z axis.

Images can be acquired at any angle relative to the three axes.

Consider an image being taken in the z/y plane so that the conductors 3a, 3b lie along the edges of the needle portion 2, there being no electrical energisation of the conductors 3 and 4 as seen on the image.

Figure 2:
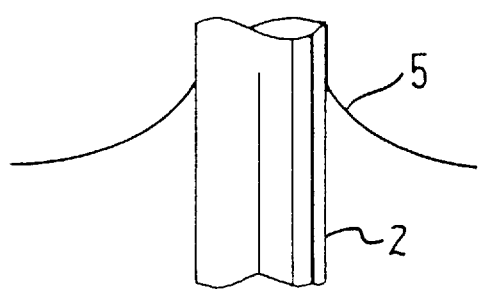
FIG. 2 is a diagrammatic representation of the magnetic field pattern around a tool to which the present invention has not been applied.

The actual magnetic field pattern round the needle portion 2 might then be as shown at 5 in FIG. 2 which is the pattern which would apply to the prior art.

Figure 3:
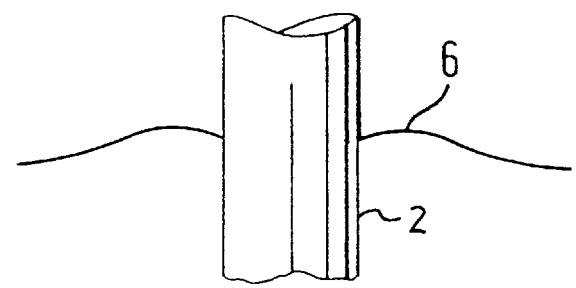
FIG. 3 is a view similar to FIG. 2 but showing the modified magnetic field pattern around a tool to which the present invention has been applied.

If the conductors 3 are now energised by passing DC or low frequency current through them this will create a small opposing field so as to minimise the effect of the susceptibility difference between the tool 1 and the patients's body to produce the changed magnetic field as indicated at 6 in FIG. 3. It is envisaged that a current of 1 to 10 milliamps would be employed but the current could be larger.

The present invention thus enables the field to be controlled to some extent so that the apparent or visualised shape of the tool can be controlled.

In using the needle it is necessary to measure its orientation to the main field. This can be done using known methods such as are used in frameless stereotaxy systems to determine tool locations and orientations in space.

A computation is then made of the currents to be passed through the various parts of the matrix of conductors carried by the needle in order to produce the desired change in the apparent shape of the needle.

This computation takes account of:
(a) the image orientation relative to the axes;
(b) the needle orientation relative to the magnetic field;
(c) the requirement to control the needle shape and size in the image data;
(d) the form of data acquisition (volume acquisitions have different requirements from the single planar ones; in the former image reconstruction can take place in any orientation).

It will be appreciated that a dense matrix of conductors is desirable in order to optimise the appearance of the needle in the image data.

As a separate exercise signal enhancement round the needle can also be obtained by passing imaging radio frequency current through the conductor pattern as well as and/or instead of the DC or low frequency susceptibility tuning current but this means that a patient's tissues can be excited locally to the tool without exciting the whole body and provides additional flexibility.

In other words the conductor pattern can be used to provide a local radio frequency (RF) system tuned to the nuclear magnetic resonance (NMR) so that it could be used as the radio frequency source for exciting the signals in addition to or instead of the normal RF coils used in +MRI equipment.

The conductor pattern could also be used as an aerial and as both a transmitter and receiver.

The conductors 3, 4 or other matrix of electrical conductors may be used on any tool or device used in an interventional MRI. For example, the matrix may be used on endoscopes with MRI capability. Endoscopes are devices inserted into a cavity in a patient's body to produce a visual image of the interior of the body cavity. Even the air in the endoscope has a significantly different susceptibility to the fluid in a patient's body resulting in significantly distortion of the image.

What is claimed is:

1. A device insertable within the anatomy of a patient and having a magnetic susceptibility substantially different from that of the anatomy so as to give rise to a distortion in a magnetic resonance image of the device when inserted in the anatomy, the device further comprising a matrix of conductors disposed on a surface of the device, energization of at least one of the matrix of conductors causing variance to a magnetic susceptibility of the device, wherein an apparent shape of the device in an image generated by a magnetic resonance imaging apparatus in the course of an interventional magnetic resonance imaging procedure may be varied.

2. The device of claim 1, wherein energization is by way of passing an electrical current through the at least one of the matrix of conductors.

3. The device of claim 2, wherein an amount of electrical current passed through one of the matrix of conductors is different than an amount of electrical current passed through another of the matrix of conductors.

4. The device of claim 1, wherein energization is by way of passing a DC or a low frequency current through the at least one of the matrix of conductors.

5. The device of claim 1, wherein the matrix of conductors is disposed flush with an outer surface of the device.

6. The device of claim 1, wherein the matrix of conductors is adhered to an outer surface of the device.

7. The device of claim 1, wherein intersecting conductors of the matrix of conductors intersect at substantially between 45 degrees and 90 degrees.

8. The device of claim 1, wherein the device is an endoscope.

9. An apparatus for use in interventional magnetic resonance imaging, the apparatus comprising:
a surgical device having a magnetic susceptibility substantially different from the magnetic susceptibility of the human anatomy so as to give rise to a distortion in an apparent shape of the surgical device an image produced using a magnetic resonance excitation and detection technique with the device inserted in the anatomy; and
means carried by the surgical device for altering the apparent shape of the surgical device in the image produced using the magnetic resonance excitation and detection technique.

10. The apparatus of claim 9, wherein said means is an energized matrix of conductors disposed on a surface of the surgical device.

11. The apparatus of claim 10, wherein said matrix covers a substantial portion of the surface of the surgical device.

12. The apparatus of claim 10, wherein said matrix of conductors is energized by way of applying current to one or more conductors of the matrix of conductors.

13. The apparatus of claim 12, wherein an amount of current applied is a function of an orientation of the surgical device in relationship to a magnetic field applied during the magnetic resonance excitation and detection technique.

14. The apparatus of claim 12, wherein an amount of current applied is based in part on an orientation of the surgical device in relationship to a local coordinate system of a magnetic field applied during the magnetic resonance excitation and detection technique.

15. The apparatus of claim 12 wherein the current is one of direct current and low frequency current.

16. A method of interventional magnetic resonance imaging, the method comprising the steps of:
inserting a device in an imaging region of a magnetic resonance imaging apparatus, said device having a magnetic susceptibility substantially different from the magnetic susceptibility of an adjacent material so as to give rise to a distortion in an apparent shape of the device an image produced using the magnetic resonance imaging apparatus, the device including a matrix of conductors disposed on a surface of the device; and energizing at least one of the matrix of conductors so as to vary a magnetic susceptibility of the device and thereby vary an apparent shape of the device in an image produced by the magnetic resonance imaging apparatus; and generating an image indicative of the shape of the device.

17. The method of claim 16, further comprising the step of:

varying an amount of electrical current applied through at least one of the matrix of conductors so as to minimize the difference between the magnetic susceptibility of the device and the magnetic susceptibility of the adjacent material.

18. The method of claim 17, wherein the amount of electrical current applied is based in part on an orientation of the device in relationship to a magnetic field applied during operation of the magnetic resonance imaging apparatus.

19. The method of claim 16, wherein the step of energizing is by way of applying an electrical current through the at least one of the matrix of conductors.

20. The method of claim 16, wherein the step of energizing passing a DC or a low frequency current through the at least one of the matrix of conductors.

21. A method of adjusting a visualized shape of a tool during an interventional magnetic resonance imaging procedure, the method comprising the steps of:

placing a tool having a matrix of conductors disposed on a surface of the tool within a magnetic field generated by a magnetic resonance imaging apparatus;

determining an orientation of the tool in the magnetic field;

computing an amount of current to apply to the matrix of conductors to obtain a desired adjustment to the apparent shape of the tool in an image produced by the magnetic resonance imaging apparatus;

applying the computed amount of current to the matrix; and generating a magnetic resonance image indicative of the shape of the tool.

22. The method of claim 21, wherein the step of generating includes acquiring magnetic resonance image data and wherein the step of computing the amount of current to apply takes into account a form in which the magnetic resonance image data is to be acquired.

23. The method of claim 21, wherein the step of computing the amount of currrent to apply takes into account the orientation of the tool in relationship to the magnetic field.

24. The method of claim 21, wherein the step of placing includes placing a tool having a matrix of conductors which covers a substantial portion of the surface of the tool within a magnetic field generated by a magnetic resonance imaging apparatus.

* * * * *